United States Patent [19]
Tsuda et al.

[11] Patent Number: 5,356,724
[45] Date of Patent: Oct. 18, 1994

[54] EXCELLENT FAR-INFRARED RADIATING MATERIAL

[75] Inventors: Tetsuaki Tsuda, Nishinomiya; Yasuhiro Yamamoto, Kobe; Junichi Uchida, Ashiya; Hirohisa Seto, Kobe; Kunihiro Fukui, Kawanishi; Shinya Hikino, Amagasaki, all of Japan

[73] Assignee: Sumitomo Metal Industries, Ltd., Osaka, Japan

[21] Appl. No.: 5,378

[22] Filed: Jan. 15, 1993

[30] Foreign Application Priority Data

Jan. 16, 1992 [JP] Japan ................................. 4-005887
Nov. 6, 1992 [JP] Japan ................................. 4-297227

[51] Int. Cl.⁵ .............................................. B32B 15/20
[52] U.S. Cl. ............................... 428/629; 428/472.2; 428/633; 428/935
[58] Field of Search ................... 428/629, 633, 472.2, 428/935; 205/172, 173

[56] References Cited

U.S. PATENT DOCUMENTS 3,268,422  8/1966  Smith et al. ........................... 204/39
4,148,294  4/1979  Scherber et al. ..................... 126/270
4,966,659 10/1990  Seto et al. ........................... 204/28

FOREIGN PATENT DOCUMENTS 1397270  2/1988  Japan .

*Primary Examiner*—John Zimmerman
*Attorney, Agent, or Firm*—Burns, Doane, Swecker & Mathis

[57] ABSTRACT

A material for producing far-infrared radiation is disclosed. The material comprises a substrate and an Al—Mn alloy-derived oxide surface layer on the substrate, the oxide surface layer being porous with an average pore diameter of 0.01–2.0 micrometers and a porosity of $10^3$–$10^{12}$ pores/cm², the weight ratio of Mn/Al of the oxide surface layer being 0.001–2.0, and the thickness of the oxide surface layer being 0.1–100 micrometers.

24 Claims, 5 Drawing Sheets

EXCELLENT FAR-INFRARED RADIATING MATERIAL

BACKGROUND OF THE INVENTION

The present invention relates to an excellent far-infrared radiating material, and more particularly to a porous oxide surface layer derived from an Al—Mn alloy layer which has excellent far-infrared radiating characteristics. The porous oxide surface layer will hereinafter be referred to as an "Al—Mn alloy-derived oxide layer" or an "Al—Mn alloy-derived oxide surface layer", or merely as an "Al—Mn oxide surface layer".

Materials having the Al—Mn system oxide surface layer of the present invention can be used for performing heating and drying in a variety of industrial fields to achieve a higher efficiency, resulting in much savings of energy. Furthermore, due to its ease of working and light weight, a material having the surface layer of the present invention may be used in many new fields in industry.

Far-infrared radiation is a form of electromagnetic radiation having a wavelength of 3–1000 micrometers. Far-infrared radiation is adsorbed into water or into organic matter to generate heat, which is effective to achieve efficient heating and drying. It is also said that in addition to the above-described thermal effect, far-infrared radiation facilitates movement of water molecules.

The latter effect is similar to the effect that microwaves, which are the next to far-infrared rays in wavelength, exert on water molecules when used in a microwave oven. Aluminum foil cannot be heated in a microwave oven, since aluminum foil does not contain water. On the other hand, when water-containing materials such as foods are irradiated by microwaves in the oven, water molecules are vibrated to generate heat energy producing a local rise in temperature, and the heat is further transferred to the whole of the object to heat it as a whole.

Far-infrared radiation does not vibrate water molecules so vigorously as do microwaves, but far-infrared rays facilitate movement of water molecules so that evaporation of water is accelerated without raising its temperature. Furthermore, much water evaporates to remove heat of evaporation, which then effectively suppresses an excess rise in temperature in the surface of the heated material.

In order to practically apply such effects as thermal energy generation and water molecular movement which are efficiently promoted by far-infrared radiation, it is necessary to develop materials having excellent capability to radiate far-infrared rays. An example of such a material is a porous Al—Mn system oxide layer, which is manufactured in such a manner that an Al—Mn alloy plate (Mn: about 2%, Mg: about 0.5%, Fe: about 0.1%, Al: bal.) prepared from a molten metal through solidification, rolling, and annealing is subjected to an anodic oxidizing treatment by conventional electrolysis at a given electric current density in a sulfate solution. An oxide film is formed to a thickness of about 30 micrometers on the surface of the plate.

Although the thus-formed conventional Al—Mn oxide layer has been tried for heating and drying in various applications, it has the problem that radiation of far-infrared rays of the porous Al—Mn oxide film is degraded when the service temperature goes up beyond 350° C.

FIG. 2 shows a relationship between the service temperature and radiation of far-infrared rays at a wavelength of 15 micrometers for the above-described conventional Al—Mn oxide layer. As is apparent from the graph, when the service temperature is over 350° C., the radiation of far-infrared rays is markedly reduced.

It is not unusual for heating or drying to be carried out at a temperature above 350° C., and therefore there are few applications in which conventional materials having an Al—Mn oxide layer can be used in conventional heating or drying apparatuses. Thus, there is a need for a material or element having an ability to generate far-infrared radiation which is not degraded substantially even when the service temperature is over 350° C.

SUMMARY OF THE INVENTION

An object of the present invention is to provide a new material or elemental product which can be manufactured easily at low costs, and which exhibits excellent capability to generate far-infrared rays at a temperature of 350° C. or above for an extended period of time.

A specific object of the present invention is to provide a material or product covered with a porous Al—Mn oxide surface layer which can be manufactured easily at low costs, and which exhibits excellent ability to generate far-infrared rays with an emissivity of 0.9 or more at a temperature of 350° C. or above for an extended period of time.

The present invention is a material having excellent far-infrared radiation generating ability, at least a portion of a substrate of which has a surface layer comprising, as an uppermost layer, a porous oxide layer derived from an Al—Mn alloy with an average pore size of 0.01–2.0 micrometers and a porosity of $10^3$–$10^{12}$ pores/cm$^2$. The weight ratio of Mn/Al of the oxide surface layer is 0.001–2.0, and the thickness of the oxide layer is 0.1–100 micrometers.

The porous Al—Mn alloy oxide surface layer may be placed directly on the surface of the substrate or it may be placed on an Al—Mn alloy (Mn: 5–50 weight %) layer which is placed on the substrate. The underlayer comprising the Al—Mn alloy preferably contains 20% by volume or more of a nonequilibrium Al—Mn alloy phase. Such an Al—Mn alloy layer can be obtained easily by plating, e.g., electrolytic plating in a fused salt bath containing aluminum chloride.

Thus, a material having an Al—Mn oxide surface layer of the present invention can be manufactured easily and inexpensively by forming on at least a portion of the surface of a substrate material an Al—Mn alloy layer containing 5–50 wt % of Mn, which comprises 20% by volume or more of a nonequilibrium Al—Mn alloy phase, and subjecting the alloy surface layer to an electrolysis treatment to effect at least partial oxidation.

The present invention is based on the following findings made by the present inventors:

(i) The radiation of far-infrared rays gets higher when the average pore diameter of an Al—Mn alloy oxide layer decreases and the pore density increases. Namely, a porous but dense oxide surface layer has excellent radiating properties. However, adjustment of the pore density only is not enough to suppress a degradation in far-infrared radiating properties at a temperature higher than 350° C.

(ii) Far-infrared radiating properties can be improved at a temperature of 350° C. or higher, such as 400°–600° C., when the Mn content of the Al—Mn alloy is increased and the weight ratio of Mn/Al of the Al—Mn alloy oxide surface layer which is produced by electrolytic oxidation of the alloy is also increased.

(iii) However, when an Al—Mn alloy substrate produced by a conventional process from a molten metal is employed, the weight ratio of Mn/Al of the oxide layer cannot be increased so much as that of the substrate alloy even if the ratio of Mn/Al of the substrate alloy is increased. Thus, there is a limit to an improvement in far-infrared radiating properties at a high temperature.

(iv) In contrast, when an Al—Mn alloy is deposited by electroplating on a suitable metallic substrate and the electroplated layer is subjected to electrolytic oxidation, the weight ratio of Mn/Al of the resulting oxide layer can be increased easily.

(v) This is because an electroplated layer has a higher proportion of the nonequilibrium Al—Mn alloy phase than an Al—Mn alloy derived from a molten metal.

(vi) The electroplated Al—Mn alloy substrate may be completely changed to an oxide layer from the surface to the bottom of the electroplated layer by carrying out complete anodizing of the layer. Alternatively, a non-oxidized Al—Mn alloy layer may be retained under an oxidized Al—Mn alloy layer by carrying out incomplete anodizing. Due to the presence of the metallic Al—Mn alloy layer, the corrosion resistance of the substrate can be further improved.

DESCRIPTION OF PREFERRED EMBODIMENTS OF THE INVENTION

Figure 1A:
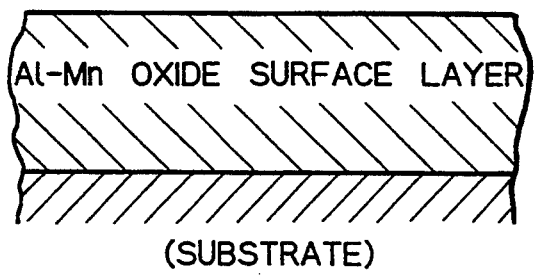
FIG. 1a is a sectional view showing a surface layer structure of a far-infrared radiative material of the present invention.
Figure 1B:
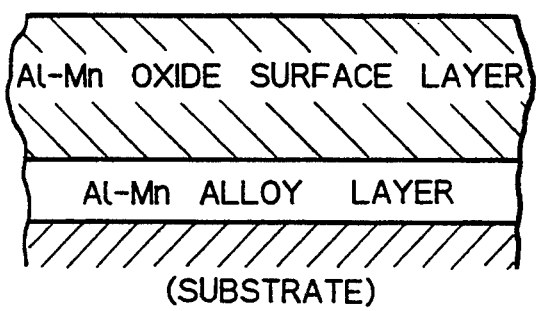
FIG. 1b is another sectional view showing a surface layer structure of a far-infrared radiative material of the present invention.

FIGS. 1a and 1b schematically show the structure of a material having the Al—Mn oxide surface layer of the present invention. As shown in FIG. 1a, a porous Al—Mn oxide layer is placed directly on a substrate surface, and, as shown in FIG. 1b, an Al—Mn alloy layer, i.e., an Al—Mn alloy electroplated layer, is first placed on the substrate surface and a porous Al—Mn alloy oxide layer is formed in the alloy layer. When the thickness of the alloy layer is very small, e.g., 0.05 micrometers or less, the presence of such a layer can be neglected and the surface layer can be considered to be comprised of a substrate and an oxide surface layer as shown in FIG. 1a.

The structure of an Al—Mn-containing surface layer is not restricted to those shown in FIGS. 1a and 1b. There is no limit on the structure as long as it comprises an Al—Mn oxide surface layer as an uppermost layer. The underlayer may be present or absent. The underlayer may be a single layer or multiple layers.

A substrate which can be used in the present invention is not restricted to a specific one, and a suitable organic or inorganic substrate may be selected depending on the use. The shape of the substrate is not restricted at all. Thus, the material or element of the present invention can be in the form of a plate, pipe, bar, or other shape depending on the use.

Preferred materials for the substrate are steels, stainless steels, plated steels such as zinc- or zinc alloy-plated steels and aluminum- or aluminum alloy-plated steels, and various non-ferrous metals such as aluminum, titanium, zirconium, nickel and their alloys. In some cases, ceramics, plastics, or glasses may be used as the substrate.

When the substrate is non-conductive, a metallized layer may be applied to the substrate by means of electroless plating or vapor plating, followed by electroplating of an Al—Mn alloy layer on the metallized layer. Alternatively, without carrying out any pretreatment, vacuum deposition processes such as spattering or ion plating may be applied to form an Al—Mn alloy plating layer on the substrate.

In still another embodiment the substrate is an Al—Mn alloy having the same alloy composition as an electroplated Al—Mn alloy layer to be oxidized by electrolysis. In this case, the Al—Mn alloy may be subjected to oxidization by electrolysis so as to provide an Al—Mn system oxide coating.

In order to further increase adhesion between the substrate and the coating of an Al—Mn oxide layer or an alloy layer, pretreatment such as pre-plating of Ni, Fe, or Co may be applied to the substrate.

According to the present invention, at least a portion of the surface of the substrate is covered with a surface layer having an average pore diameter of 0.01–2.0 micrometers, a pore density of $10^3$–$10^{12}$ per $cm^2$, an Mn/Al weight ratio of 0.001–2.0, and a thickness of 0.1–100 micrometers.

The Mn/Al weight ratio of the oxide layer means the weight ratio of the total amount of Mn to the total amount of Al, which are present as oxides in the oxide layer. The weight ratio may be measured directly from the data of the EPMA or XPS. Alternatively, the ratio may be determined by an atomic-absorption spectroscopic analysis of an alkaline solution of the layer.

Figure 2:
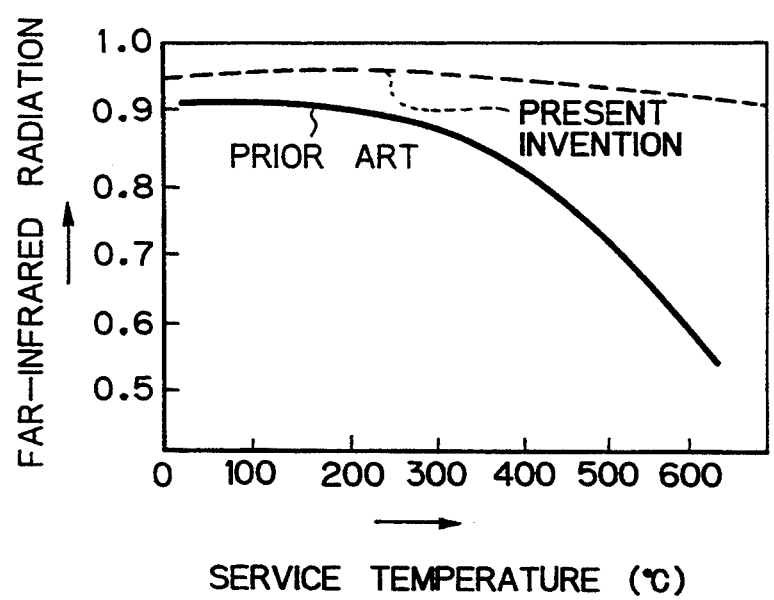
FIG. 2 is a graph showing the relationship between the service temperature and the far-infrared radiation for the prior art and the present invention.

It is not yet clear why such an Al—Mn oxide layer can maintain excellent far-infrared radiating properties at high temperatures. It is supposed that the surface layer having the mixing ratio of Al oxides to Mn oxides, i.e., the weight ratio of Mn/Al of the oxide surface layer in the range of 0.001–2.0 can exhibit stability of structure at high temperatures, and far-infrared rays radiated from complex oxides of Al and Mn respectively undergo resonance and amplification. Thus, as indicated in FIG. 2, the material according to the present invention maintains the far-infrared radiation around 0.9 or higher at a temperature over 350° C., and there is substantially no decrease in the far-infrared radiation at high temperatures.

However, when the weight ratio of Mn/Al is less than 0.001, since the amount of Mn is smaller than that required, the emissivity of the far-infrared radiation falls to less than 0.9 at higher temperatures. On the other hand, when the ratio of Mn/Al is over 2.0, the formability of the oxide layer is degraded, making it difficult to shape the material having the Al—Mn oxide layer. A preferable range of the Mn/Al weight ratio is 0.01–1.5, and a most preferable range is 0.01–1.0.

Porosity of the porous oxide surface layer of the present invention, i.e., pore diameter and pore density are predominant factors to determine the far-infrared radiating properties. Excellent far-infrared radiation can be ensured by adjusting the pore diameter and pore density to suitable values.

The reason why the porosity of the surface oxide layer is important to the far-infrared radiation is thought to be that far-infrared rays radiated from the walls and bottoms of pores are repeatedly reflected, absorbed, diffracted, and interfere in numerous pores, and the amount of far-infrared rays radiated from the overall oxide surface layer can be controlled by the porosity of the surface layer as a whole.

Figure 3:
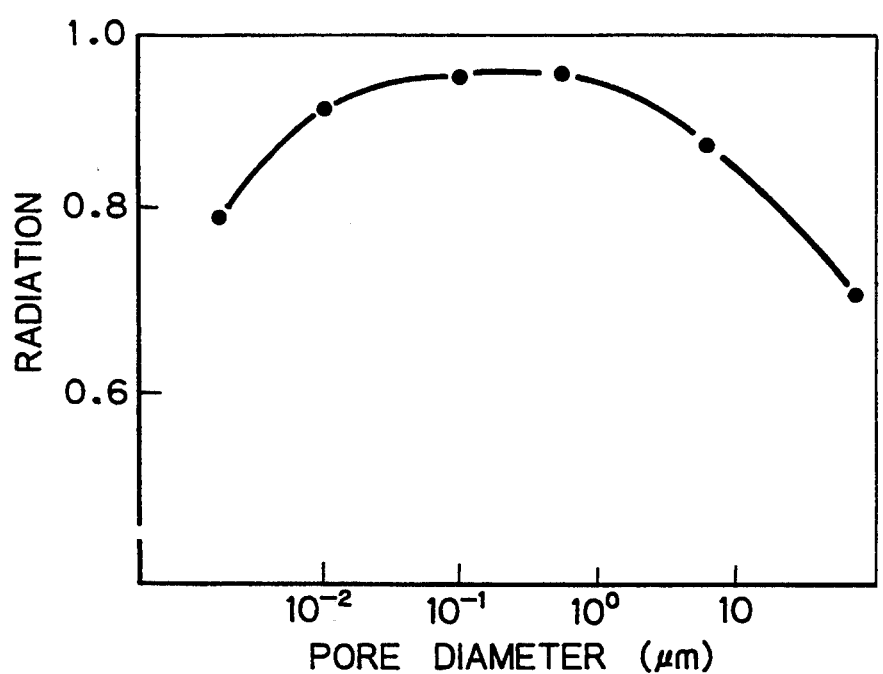
FIGS. 3–5 are graphs showing results of the working example of the present invention.
Figure 4:
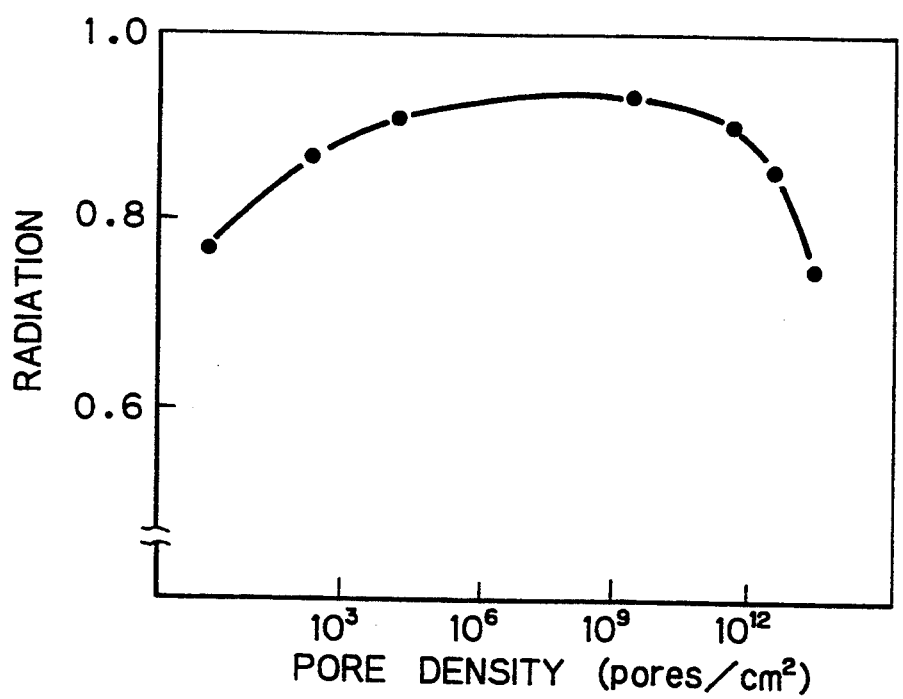
Figure 5:
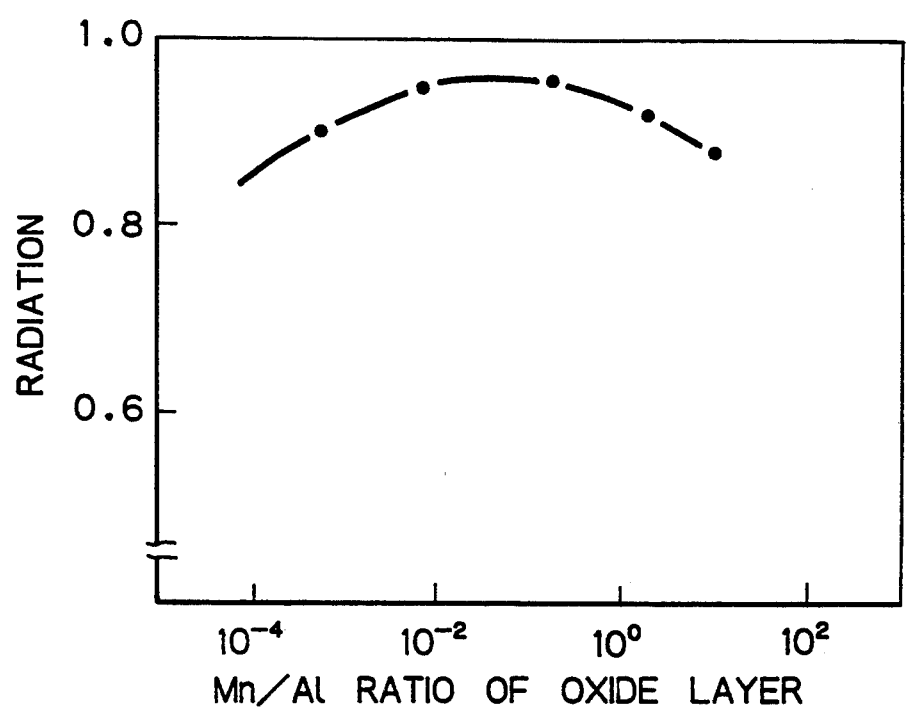

As shown in FIGS. 3 and 4, when the surface layer has an average pore diameter of 0.01–2.0 micrometers and a pore density of $10^3$–$10^{12}$ pores per cm$^2$, a far-infrared radiation emissivity of 0.9 or higher can be obtained at high temperatures. When the pore diameter or pore density is outside the range of the present invention, the far-infrared radiating properties are degraded. A preferred average pore diameter is 0.05–1.0 micrometer and a preferred pore density is $10^8$–$10^{11}$ pores per cm$^2$.

The pore diameter and pore density of the oxide layer can be measured by directly observing the surface of the oxide film with a scanning electron microscope.

The thickness of the uppermost Al—Mn oxide film is 0.1–100 micrometers. When the thickness is less than 0.1 micrometer, the far-infrared radiation is not adequate to achieve the purpose of the present invention. On the other hand, when it is over 100 micrometers, the effect thereof is saturated. A thickness over 100 micrometers is not desirable from a cost viewpoint, either. Preferably, the thickness is 1–100 micrometers and most preferably it is 5–50 micrometers.

The above-defined porous Al—Mn oxide surface layer can be produced by first forming an Al—Mn alloy surface layer having an Mn content of 5–50 weight % and containing 20 volume % or more of nonequilibrium Al—Mn alloy phase and then oxidizing the surface layer.

When the Al—Mn alloy surface layer is oxidized thoroughly, an Al—Mn coating material is formed in which the substrate is directly covered with an Al—Mn oxide surface layer, as is illustrated in FIG. 1a. However, a small amount of the Al—Mn alloy layer inevitably remains unoxidized, and it is considered that the Al—Mn alloy layer has been completely oxidized when the thickness of such a remaining Al—Mn alloy layer is 0.05 micrometers or less.

On the other hand, when the oxidization of the Al—Mn alloy surface layer is carried out incompletely, just the surface thereof is oxidized and the portions underneath the surface remain unoxidized. When the thickness of the unoxidized layer is larger than 0.05 micrometers, the resulting material comprises, as shown in FIG. 1b, a substrate, an Al—Mn alloy underlayer, and an Al—Mn oxide surface layer.

If the material is used in severe environments, i.e., in the presence of brine in a humid and high temperature atmosphere, such a material as shown in FIG. 1b in which an Al—Mn alloy layer is present underneath the surface layer is preferred, since the Al—Mn alloy underlayer is corrosion resistant and can protect the substrate under such severe corrosive conditions to extend its service life.

When the Mn content of the Al—Mn alloy is less than 5% by weight or more than 50% by weight, it is difficult to provide an oxide surface layer having a weight ratio of Mn/Al of 0.001–2.0, and the corrosion resistance of an underlayer, if it remains unoxidized, is degraded. When the Mn content of the underlayer is 20–40% by weight, formability is excellent. Thus, a preferred Mn content is 20–40% by weight for the initial Al—Mn alloy layer or the underlayer after oxidation.

The Al—Mn system alloy may further contain the following additive elements in addition to Al and Mn: Cu, Ag, Fe, Co, Ni, Mg, Ca, Sr, Ba, Zn, Cd, In, Tl, Si, Ge, Sn, Pb, As, Sb, Bi, Ti, Zr, Hf, V, Nb, Ta, Cr, Mo, W, and Re.

The nonequilibrium Al—Mn alloy phase of an Al—Mn system alloy means all the alloy phases other than equilibrium crystal phases such as Al$_6$Mn, Al$_3$Mn, and fcc-Al (face-centered cubic aluminum). The nonequilibrium phase may include an almost crystallized Al—Mn alloy phase and an amorphous Al—Mn alloy phase. The Al—Mn alloy phase which constitutes the initial surface layer or the underlayer preferably comprises 20% by volume or more of the non-equilibrium Al—Mn alloy phase. As the content of the nonequilibrium Al—Mn alloy phase is increased, the weight ratio of the Mn/Al oxide layer after oxidation is increased with an improvement in the far-infrared radiating properties at high temperatures.

Various alloy phases present in the Al—Mn system alloy layer may be easily identified by observing the alloy layer with a transmission electron microscope (TEM). Thus, the volume ratio of a nonequilibrium Al—Mn alloy phase can be measured directly by observation with a TEM.

Figure 6:
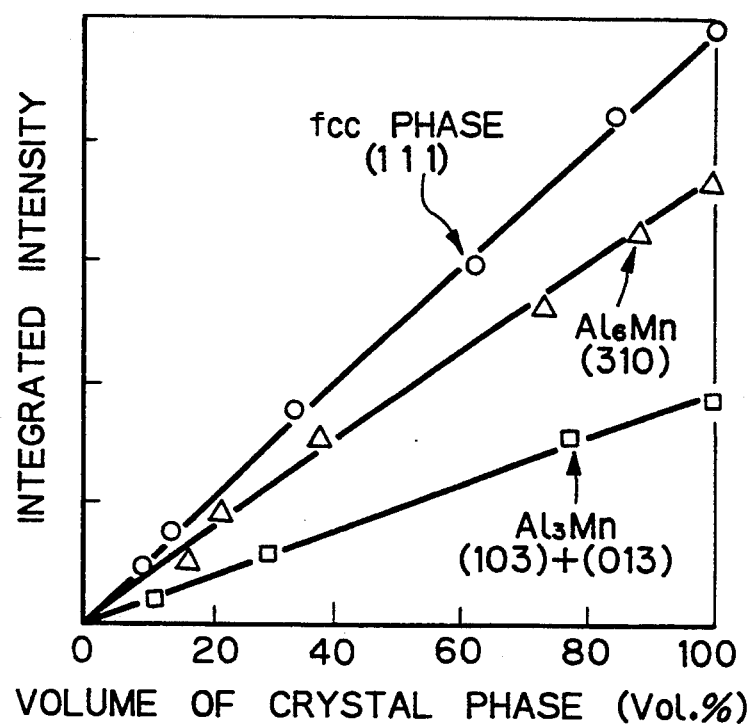
FIG. 6 is a graph showing the relationship between the integrated intensity of an X-ray diffraction pattern of an Al—Mn alloy and the volume ratio of crystal phases.

In addition, as shown in FIG. 6, the volume ratio of equilibrium alloy phases such as Al$_6$Mn, Al$_3$Mn, and fcc-Al, which has been determined by observation with a TEM, is proportional to the X-ray scattered intensity (integrated intensity of an X-ray diffraction pattern), which is measured by the X-ray diffraction analysis. This means that by using the above-described relationship shown in FIG. 6 as a calibration curve, the volume ratio of the equilibrium Al—Mn alloy phase can easily be determined by X-ray diffraction analysis. The volume ratio of nonequilibrium Al—Mn alloy phases can be obtained by subtracting the total amount of the volume ratio of each of the equilibrium alloy phases from 100%.

Generally it is known that an electroplated layer in an as-plated form, i.e., without application of heat treatment, is thermally in a nonequilibrium state, and the proportion of nonequilibrium phases is very high. Thus, it is easy to produce an Al—Mn alloy having a volume ratio of 20% or more of nonequilibrium Al—Mn alloy phases by electroplating of an Al—Mn alloy in a fused salt or in a nonaqueous solution.

Furthermore, it is also possible to form such thermally nonequilibrium Al—Mn alloy phases by means of dry plating methods, such as spattering or ion plating, rapid solidification methods, ion beam mixing methods, or mechanical alloying methods for fine particles.

The most convenient and least expensive method for producing such an Al—Mn alloy is electrolytic plating in a fused salt bath employing a chloride salt bath containing aluminum chloride. Suitable examples of a fused salt bath are $AlCl_3$—KCl—NaCl—$MnCl_2$, and $AlCl_3$-ethyl, methyl-imidazoliumchloride(EMIC)—$MnCl_2$. When a nonaqueous or vacuum system is employed, the process requires expensive equipment and the film-forming rate is small, resulting in a low production rate with an increase in production costs.

As mentioned before, the volume ratio of the nonequilibrium alloy phases is restricted to 20% or more in the present invention. However, an Al—Mn alloy which has been produced by way of casting a molten metal is thermally in an equilibrium state, and the volume ratio of nonequilibrium alloy phases is much less than 20% for such an Al—Mn alloy. Thus, if the substrate is an Al—Mn alloy produced by a method such as casting, it is desirable that an electroplating of an Al—Mn alloy having a volume ratio of nonequilibrium alloy phases of 20% or more be placed on the surface of the substrate. Alternatively, it is also possible to increase the volume ratio of nonequilibrium alloy phases to higher than 20% by means of nonequilibrium treatments such as argon gas spattering.

As mentioned before, when the initial Al—Mn alloy has a small volume ratio of nonequilibrium alloy phases, the oxide surface layer derived from the Al—Mn alloy surface layer via electrolytic oxidation also has a small weight ratio of Mn/Al. The reasons for this are thought to be as follows.

An Al—Mn alloy which is produced by casting substantially under thermal equilibrium conditions in a dual phase mixing state comprises an Mn-dissolved Al phase and Al—Mn crystals dispersed therein. However, compared with the Al phase, the $Al_6Mn$ crystal phase is inert to the anodizing, and the $Al_6Mn$ crystal phase is hard to oxidize during electrolytic oxidation. As a result, the $Al_6Mn$ crystal phase remains finely dispersed in the oxide layer. Thus, if the Mn content of the alloy is increased, the added Mn is formed into $Al_6Mn$ crystals with an increase in the amount of $Al_6Mn$ crystals, but without an increase in the ratio of Mn/Al of the oxide film layer.

In addition, since a large amount of $Al_6Mn$ crystal phases remain unoxidized, the pore structure of the porous film obtained by electrolysis is not uniform and the $Al_6Mn$ crystals make no contribution to strengthen the far-infrared radiation even at a temperature below 350° C.

On the other hand, since an electroplated Al—Mn alloy layer contains little or no crystal phase and it comprises metastable crystals or amorphous phases of an Al—Mn alloy, which are thermally in a nonequilibrium state, precipitation of $Al_6Mn$ crystals is suppressed, and most of Mn is extremely uniformly dissolved into the Al phase in a metallic state. The thus-dissolved Mn acts the same as Al, and both Mn and Al are oxidized easily to increase the Mn/Al weight ratio of the oxide surface layer after electrolytic oxidation.

Furthermore, since the amount of $Al_6Mn$ crystal phases is small, the resulting oxide layer has a small average pore size, a high pore density, and a dense pore structure with an improvement in far-infrared radiation at a temperature lower than 350° C. Thus, according to the present invention a material having an Al—Mn system oxide surface layer can be obtained, the surface layer exhibiting excellent far-infrared radiating properties even at high temperatures.

The thickness of the initial Al—Mn alloy layer is not restricted to a specific one and can be determined after consideration of the target thickness of an oxide surface layer and/or the thickness of an Al—Mn alloy underlayer to be left. However, when the Al—Mn alloy layer is prepared by electrolytic plating and the thickness thereof is over 100 micrometers, the surface of a plated layer is roughened markedly to give a dendrite-like or powder-like surface appearance. The thickness of the initial Al—Mn alloy layer, therefore, is preferably restricted to not larger than 100 micrometers. Even if the initial Al—Mn alloy layer is prepared by a method other than electroplating, a thickness larger than 100 micrometers adds to manufacturing costs, so it is preferable to restrict the thickness to not larger than 100 micrometers.

Preparation of an Al—Mn system oxide film from the Al—Mn alloy layer can be performed by any method by which a porous oxide surface layer having the above-described Mn/Al ratio and porosity can be obtained. For example, chemical oxidation treatment using a suitable oxidizing agent, e.g., a high temperature steam, alkalis, and chromic acid may be employed. From a cost standpoint, it is preferable to carry out electrolytic oxidation, i.e., anodizing in order to obtain an Al—Mn oxide layer.

The weight ratio of Mn/Al of the oxide layer can be adjusted to a predetermined one by varying the Mn content of the initial Al—Mn alloy surface layer in the case of chemical oxidation treatment, or by varying a current frequency at an anode to 1–100 Hz in the case of electrolytic oxidation.

The pore diameter and pore density can be adjusted to suitable values by varying the duty cycle of current at an anode within the range of 20–80%.

The thickness of the oxide surface layer can be adjusted by varying the time of oxidation treatment. According to the present invention, since the Mn content of the Al—Mn alloy is rather high, it is preferable to employ an electrolytic oxidation using a periodically reversed current in which the polarity of the current is reversed periodically. The electrolyte employed in the present invention contains sulfuric acid, oxalic acid, chromic acid, phosphoric acid, aromatic sulfonic acid, sodium phosphate, sodium fluoride, or the like which are conventionally employed for electrolytic oxidation of Al or Al alloys.

EXAMPLES

As a substrate, an aluminum plate, aluminum alloy plate, titanium plate, titanium alloy plate, stainless steel plate, alloyed galvanized steel plate, aluminum alloy-molten plated steel plate, and aluminum-vapor deposited steel plate were employed. All the substrates were prepared by casting a molten metal.

Onto both surfaces of these substrates, an Al—Mn alloy layer was plated by either of the following ways (1) or (2):

(1) An Al—Mn alloy layer was electroplated using a fused salt bath (Test Run Nos. 4–26):
  (a) A salt bath of $AlCl_3$—KCl—NaCl—$MnCl_2$ was used as the fused salt bath. The bath temperature was kept at 100°–280° C., and the current density was 50 A/$dm^2$. The thickness of Al—Mn alloy surface layer was controlled by adjusting the electric current density, and the Mn content of the surface layer was adjusted by the addition of $MnCl_2$ to the salt bath.

(b) Another salt bath containing AlCl$_3$—EMIC—MnCl$_2$ was used as the fused salt bath. The bath temperature was kept at 10°-80° C., and the current density was 20 A/dm$^2$. The thickness and the Mn content of the Al—Mn alloy surface layer were controlled in the same manner as in (a) above. The resulting Al—Mn alloy surface layer was confirmed to be substantially the same as that obtained in accordance with method (a), and as a substrate for the following electrolytic oxidation that obtained by method (a) was used.

(2) An Al—Mn alloy layer was deposited by spattering (Test Run Nos. 27-31):

An Al—Mn alloy plate (Mn: 5-50% by weight) prepared by casting a molten metal was used as a target plate, and spattering onto the target was carried out at an output power of 150 W using a vacuum chamber kept at a vacuum of $10^{-6}$-$10^{-7}$ torr. The thickness of the Al—Mn alloy plated on the substrate was adjusted by varying the spattering time, and the Mn content of the plated layer was adjusted by varying the Mn content of the target member.

The Mn content of the plated Al—Mn alloy layer was determined by atomic absorption analysis of a solution into which the surface alloy layer had been dissolved, and the volume ratio of the nonequilibrium Al—Mn alloy phase was determined with a TEM.

The thus-obtained Al—Mn alloy-plated substrates were then subjected to electrolytic oxidation treatment to effect anodizing of at least the surface of the Al—Mn alloy layer. The electrolyte employed was an aqueous solution (pH: 3-5) containing 5-20 g/l of phosphoric acid and 10-30 g/l of ammonium bichromate. The substrates were subjected to anodizing at 10-100 V and 10-100 Hz. During the electrolysis, the pore diameter and pore density were controlled by changing the polarity of electric current between the substrate and the opposite electrode (carbon electrode) frequently and by adjusting the duty cycle of current at the anode to be 20-80%.

The thickness of the thus-obtained uppermost oxide layer and the underlayer of an Al—Mn alloy, and the average pore diameter and pore density of the oxide surface layer were determined by observation of the surface layer with an SEM. The weight ratio of Mn/Al of the oxide layer was determined with the XPS.

Process conditions for the preparation of the initial and final surface layers are summarized in Table 1. In Table 1, the far-infrared radiative material of the present invention, in which the thickness of the Al—Mn alloy underlayer is less than 0.05 micrometers corresponds to that shown in FIG. 1a, in which complete anodic oxidation from the surface to the bottom of the surface layer was achieved.

The far-infrared radiation was evaluated for each of the thus-obtained materials in the manners described below. The test results are shown in Table 2.

(1) Measurement of far-infrared radiation:

A sample was kept at a temperature of 500° C., and the radiation from the sample was measured with an infrared spectrophotometer (Type IR-810, Nihon Kogaku K. K.). A covering area in terms of wavelength was a wavelength of 4-30 micrometers and the results are on the average. An emissivity of far-infrared radiation of 0.9 or more was evaluated as good.

(2) Ability to dry lumber

A sample was fixed to a heating member of a drying apparatus for lumber. 10 sheets of fir lumber (35 mm thick, 100 mm wide, and 2000 mm long) were dried at 60°-70° C., and the time elapsed until the water content of the lumber was reduced from 45% to 15% was determined. After drying, the sheets were examined as to whether cracks or curves existed.

(3) Taste of boiled rice:

An aluminum pot was used to boil rice. On the inner surface of the pot, an Al—Mn oxide layer was provided in accordance with the present invention. For comparison, a pot without such a coating was used.

Using these pots, the same type of rice was boiled under the same conditions, and each of the rice samples was tasted by 50 people.

The far-infrared radiating properties of the pot having a coating of the present invention was determined by the number of people who answered that the taste of the rice boiled with a pot having a coating was better than the taste of the rice boiled in the uncoated pot. In Table 1, the symbol "O" indicates that more than 45 people answered that the taste of the rice boiled in a pot having a coating of the present invention was better, the symbol "Δ" indicates that 45-35 people answered that it tasted better, and the symbol "X" indicates that less than 25 people answered that it tasted better.

(4) Far-infrared radiation after corrosion test:

First, samples were subjected to a severe corrosion test in which a cycle of salt spraying (5% of NaCl solution, 35° C.), wetting (40° C., RH 75%), allowing to stand in the room, and drying (50° C., RH 20%) was repeated. Each step took 1 hour and one cycle took 4 hours. After 200 cycles, the samples were subjected to measurement of far-infrared radiation in the same manner as in Test (1). A difference in radiation before and after the test for each of the samples was evaluated in three grades. In Table 1, the symbol "O" indicates a difference within 5%, the symbol "Δ" indicates a difference between 5-10%, and the symbol "X" indicates a difference larger than 10%.

TABLE 1

| Run No. | Substrate | Al—Mn Alloy Plating Layer | | | Al—Mn Oxide Surface Layer | | | | Remarks |
|---|---|---|---|---|---|---|---|---|---|
| | | Thickness (μm) | Mn (wt %) | Nonequilibrium Alloy Phose (vol %) | Thickness (μm) | Mn/Al Weight Ratio | Pore Diameter (μm) | Porosity (pores/cm$^2$) | |
| 1 | Al-20% Mn Alloy Plate | — | — | — | 15 | <0.0001* | 0.1 | $10^{2*}$ | Comparative |
| 2 | Al-2% Mn-0.5% Mg-0.1% Fe Alloy Plate | — | — | — | 50 | <0.0001* | 0.2 | $10^{11}$ | |
| 3 | Al-10% Si Hot-Dip-plated Steel Plate | — | — | — | 5 | <0.0001* | 0.08 | $10^{10}$ | |
| 4 | Pure Al Plate | 0.1 | 2.6 | 0 | 50 | <0.001* | 0.05 | $10^9$ | |
| 5 | " | 0.05 | 80 | 15 | 40 | 2.1* | 0.2 | $10^{10}$ | |

TABLE 1-continued

| Run No. | Substrate | Al—Mn Alloy Plating Layer ||| Al—Mn Oxide Surface Layer |||| Remarks |
| --- | --- | --- | --- | --- | --- | --- | --- | --- | --- |
| | | Thickness ($\mu$m) | Mn (wt %) | Nonequilibrium Alloy Phase (vol %) | Thickness ($\mu$m) | Mn/Al Weight Ratio | Pore Diameter ($\mu$m) | Porosity (pores/cm$^2$) | |
| 6 | SUS410 Stainless Plate | 0.03 | 30 | 60 | 30 | 0.1 | 0.4 | $10^{13}$* | |
| 7 | " | 1.3 | 20 | 45 | 40 | 0.08 | 2.2* | $10^8$ | |
| 8 | " | 30 | 25 | 60 | 0.05* | 0.57 | 0.45 | $10^{10}$ | |
| 9 | Pure Al Plate | 0.03 | 40 | 80 | 30 | 0.8 | 0.3 | $10^{10}$ | Present Invention |
| 10 | SUS410 Stainless Plate | 30 | 5 | 23 | 0.5 | 0.02 | 0.08 | $10^9$ | |
| 11 | Al Vapor-Deposited Steel Plate | 7.5 | 10 | 30 | 40 | 0.05 | 0.2 | $10^{11}$ | |
| 12 | Alloyed Galvanized Steel Plate | 10 | 40 | 87 | 50 | 1.1 | 0.1 | $10^{10}$ | |
| 13 | " | 5 | 30 | 80 | 30 | 0.68 | 0.8 | $10$* | |
| 14 | SUS430 Stainless Plate | 10 | 10 | 35 | 80 | 0.09 | 0.05 | $10^{12}$ | |
| 15 | " | 12 | 45 | 90 | 10 | 0.82 | 0.4 | $10^9$ | |
| 16 | " | 40 | 26 | 80 | 2 | 0.6 | 0.23 | $10^{10}$ | |
| 17 | SUS304 Stainless Plate | 0.03 | 30 | 85 | 45 | 0.03 | 0.17 | $10^4$ | |
| 18 | " | 0.01 | 30 | 87 | 48 | 0.03 | 0.14 | $10^6$ | |
| 19 | " | 0.01 | 30 | 85 | 50 | 0.02 | 0.15 | $10^{10}$ | |
| 20 | " | 10 | 30 | 85 | 45 | 0.9 | 0.14 | $10^{11}$ | |
| 21 | " | 5 | 43 | 90 | 56 | 1.4 | 0.09 | $10^{11}$ | |
| 22 | Pure Ti Plate | 4 | 30 | 87 | 35 | 0.4 | 0.34 | $10^{10}$ | |
| 23 | Al-1.2% Mn Alloy Plate | 20 | 35 | 86 | 40 | 0.7 | 0.15 | $10^{10}$ | |
| 24 | Ti-6% Al-4% V Alloy Plate | 10 | 25 | 80 | 35 | 0.55 | 0.17 | $10^{10}$ | |
| 25 | Al-5% Mg-2% Si Alloy Plate | 2 | 40 | 90 | 55 | 0.95 | 0.12 | $10^{11}$ | |
| 26 | Cold Rolled Steel Plate | 10 | 30 | 95 | 30 | 1.0 | 0.2 | $10^{10}$ | |
| 27 | Pure Al Plate | 0.05 | 35 | 85 | 70 | 1.0 | 0.35 | $10^9$ | |
| 28 | SUS410 Stainless Plate | 5 | 15 | 45 | 55 | 0.34 | 0.12 | $10^{10}$ | |
| 29 | SUS430 Stainless Plate | 10 | 35 | 90 | 80 | 0.68 | 0.28 | $10^9$ | |
| 30 | Al-1.2% Mn Alloy Plate | 0.5 | 10 | 34 | 86 | 0.10 | 0.80 | $10^8$ | |
| 31 | Al-5% Mg-2% Si Alloy Plate | 1.6 | 25 | 67 | 55 | 0.30 | 0.13 | $10^{10}$ | |

NOTE:
*Outside the range of the present invention.
Run No. 1-3: The substarate was oxidized:
Run No. 4-26: Electroplated Al—Mn alloy layer using fused salt bath:
Run No. 27-31: Spattered Al—Mn alloy layer

TABLE 2

| Run No. | Far-Infrared Radiation (500° C.) || Drying of Fir Lumber ||| Remarks |
| --- | --- | --- | --- | --- | --- | --- |
| | Before Corrosion | After Corrosion | Days Required | Cracks Curves | Taste Test | |
| 1 | 0.3 | x(0.2) | 7 | Yes | x | Comparative |
| 2 | 0.6 | x(0.4) | 4 | " | x | |
| 3 | 0.5 | x(0.4) | 7 | " | x | |
| 4 | 0.7 | Δ(0.62) | 5 | " | x | |
| 5 | 0.6 | x(0.4) | 6 | " | x | |
| 6 | 0.85 | Δ(0.80) | 4 | None | Δ | |
| 7 | 0.8 | Δ(0.74) | 4 | " | Δ | |
| 8 | 0.6 | Δ(0.65) | 5 | Yes | x | |
| 9 | 0.95 | ◯(0.93) | 2 | None | ◯ | Present Invention |
| 10 | 0.91 | ◯(0.90) | 2 | " | ◯ | |
| 11 | 0.92 | ◯(0.90) | 2 | " | ◯ | |
| 12 | 0.94 | ◯(0.92) | 2 | " | ◯ | |
| 13 | 0.91 | ◯(0.90) | 2 | " | ◯ | |
| 14 | 0.96 | ◯(0.94) | 2 | " | ◯ | |
| 15 | 0.90 | ◯(0.89) | 2 | " | ◯ | |
| 16 | 0.90 | ◯(0.88) | 2 | " | ◯ | |
| 17 | 0.90 | ◯(0.90) | 2 | " | ◯ | |
| 18 | 0.90 | ◯(0.90) | 2 | " | ◯ | |
| 19 | 0.92 | ◯(0.90) | 2 | " | ◯ | |
| 20 | 0.97 | ◯(0.95) | 2 | " | ◯ | |
| 21 | 0.96 | ◯(0.93) | 2 | " | ◯ | |
| 22 | 0.92 | ◯(0.90) | 2 | " | ◯ | |
| 23 | 0.94 | ◯(0.92) | 2 | " | ◯ | |
| 24 | 0.93 | ◯(0.92) | 2 | " | ◯ | |

TABLE 2-continued

| | Far-Infrared Radiation (500° C.) | | Drying of Fir Lumber | | | |
|---|---|---|---|---|---|---|
| Run No. | Before Corrosion | After Corrosion | Days Required | Cracks Curves | Taste Test | Remarks |
| 25 | 0.96 | ◯(0.93) | 2 | " | ◯ | |
| 26 | 0.95 | ◯(0.93) | 2 | " | ◯ | |
| 27 | 0.95 | ◯(0.92) | 2 | " | ◯ | |
| 28 | 0.92 | ◯(0.90) | 2 | " | ◯ | |
| 29 | 0.98 | ◯(0.95) | 2 | " | ◯ | |
| 30 | 0.94 | ◯(0.92) | 2 | " | ◯ | |
| 31 | 0.93 | ◯(0.91) | 2 | " | ◯ | |

What is claimed:

1. A material for producing far-infrared radiation comprising a substrate and an oxide surface layer derived from an Al—Mn alloy on the substrate, the oxide surface layer being porous with an average pore diameter of 0.01–2.0 micrometers and a porosity of $10^3$–$10^{12}$ pores/cm$^2$, the weight ratio of Mn/Al of the oxide surface layer being 0.001–2.0, and the thickness of the oxide surface layer being 0.1–100 micrometers.

2. A material as claimed in claim 1, which further comprises an underlayer to said oxide surface layer comprising an Al—Mn alloy layer containing 5–50% by weight of Mn.

3. A material as claimed in claim 1 wherein the Al—Mn alloy layer contains 20% by volume or more of a nonequilibrium Al—Mn alloy phase.

4. A material as claimed in claim 1 wherein the Al—Mn alloy layer is formed by electroplating using a fused salt bath.

5. The far-infrared radiating material as claimed in claim 1, wherein the substrate comprises steel, stainless steel, plated steel, aluminum, titanium, zirconium, nickel or alloy thereof.

6. The far-infrared radiating material as claimed in claim 1, wherein the substrate comprises a ceramic material.

7. The far-infrared radiating material as claimed in claim 1, wherein the material exhibits a far-infrared radiation of at least about 0.9 at temperatures of 350° C. and above.

8. The far-infrared radiating material as claimed in claim 1, wherein the Mn/Al weight ratio is 0.01–1.5.

9. The far-infrared radiating material as claimed in claim 1, wherein the porosity is $10^8$–$10^{11}$ pores/cm$^2$.

10. The far-infrared radiating material as claimed in claim 1, wherein the thickness of the oxide surface layer is 5–50 micrometers.

11. The far-infrared radiating material as claimed in claim 1, wherein the oxide surface layer is on an Al—Mn underlayer having 20–40 weight % Mn.

12. The far-infrared radiating material as claimed in claim 1, wherein the porous oxide surface layer comprises an uppermost layer.

13. A far-infrared radiating article comprising a substrate and an oxide surface layer derived from an Al—Mn alloy formed on the substrate, the oxide surface layer being porous with an average pore diameter of 0.01–2.0 micrometers and a porosity of $10^3$–$10^{12}$ pores/cm$^2$, the weight ratio of Mn/Al of the oxide surface layer being 0.001–2.0, and the thickness of the oxide surface layer being 0.1–100 micrometers.

14. A far-infrared radiating article as claimed in claim 13, which further comprises an underlayer to said oxide surface layer comprising an Al—Mn alloy layer containing 5–50% by weight of Mn.

15. A far-infrared radiating article as claimed in claim 13, wherein the Al—Mn system alloy layer contains 20% by volume or more of a nonequilibrium Al—Mn alloy phase.

16. A far-infrared radiating article as claimed in claim 13, wherein the Al—Mn alloy layer is formed by electroplating using a fused salt bath.

17. The far-infrared radiating article as claimed in claim 13, wherein the substrate comprises steel, stainless steel, plated steel, aluminum, titanium, zirconium, nickel or alloy thereof.

18. The far-infrared radiating article as claimed in claim 13, wherein the substrate comprises a ceramic material.

19. The far-infrared radiating article as claimed in claim 13, wherein the article exhibits a far-infrared radiation of at least about 0.9 at temperatures of 350° C. and above.

20. The far-infrared radiating article as claimed in claim 13, wherein the Mn/Al weight ratio is 0.01–1.5.

21. The far-infrared radiating article as claimed in claim 13, wherein the porosity is $10^8$–$10^{11}$ pores/cm$^2$.

22. The far-infrared radiating article as claimed in claim 13, wherein the thickness of the oxide surface layer is 5–50 micrometers.

23. The far-infrared radiating article as claimed in claim 13, wherein the oxide surface layer is on an Al—Mn underlayer having 20–40 weight % Mn.

24. The far-infrared radiating article as claimed in claim 13, wherein the porous oxide surface layer comprises an uppermost layer.

* * * * *